(12) United States Patent
Wang

(10) Patent No.: US 11,616,489 B2
(45) Date of Patent: Mar. 28, 2023

(54) BULK ACOUSTIC WAVE FILTER HAVING RELEASE HOLE AND FABRICATING METHOD OF THE SAME

(71) Applicant: Shenzhen Newsonic Technologies Co., Ltd., Shenzhen (CN)

(72) Inventor: Jian Wang, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/807,944

(22) Filed: Jun. 21, 2022

(65) Prior Publication Data
US 2022/0368309 A1 Nov. 17, 2022

(51) Int. Cl.
*H03H 9/54* (2006.01)
*H03H 9/02* (2006.01)
*H03H 9/205* (2006.01)
*H03H 9/13* (2006.01)

(52) U.S. Cl.
CPC .......... *H03H 9/54* (2013.01); *H03H 9/02031* (2013.01); *H03H 9/13* (2013.01); *H03H 9/205* (2013.01)

(58) Field of Classification Search
CPC ............. H03H 9/02; H03H 9/205; H03H 9/54
See application file for complete search history.

(56) References Cited

U.S. PATENT DOCUMENTS

| | | | | |
|---|---|---|---|---|
| 6,714,102 B2* | 3/2004 | Ruby | ...................... | H03H 3/02 310/365 |
| 6,842,089 B2* | 1/2005 | Lee | .......................... | H03H 3/04 333/191 |
| 7,212,082 B2* | 5/2007 | Nagao | ................... | H01L 41/316 333/187 |
| 7,391,285 B2* | 6/2008 | Larson, III | ......... | H03H 9/02102 333/32 |
| 7,443,270 B2* | 10/2008 | Motai | .................... | H03H 9/587 333/133 |
| 8,723,623 B2* | 5/2014 | Hara | ...................... | H03H 9/605 29/25.35 |
| 10,355,659 B2* | 7/2019 | Kim | ........................ | H01L 41/29 |

* cited by examiner

*Primary Examiner* — Hafizur Rahman
*Assistant Examiner* — Alan Wong
(74) *Attorney, Agent, or Firm* — Finnegan, Henderson, Farabow, Garrett & Dunner

(57) ABSTRACT

A bulk acoustic wave filter includes: a first bulk acoustic wave resonator including, in an order from bottom to top, a first cavity, a first bottom electrode, a first segment of a piezoelectric layer, and a first top electrode; a second bulk acoustic wave resonator disposed adjacent to the first bulk acoustic wave resonator, and including, in the order from bottom to top, a second cavity, a second bottom electrode, a second segment of the piezoelectric layer, and a second top electrode; a boundary structure surrounding the first cavity and the second cavity, the boundary structure including a boundary portion extending between and separating the first cavity and the second cavity, and the boundary portion being disconnected at a disconnection region; and a first release hole formed in the piezoelectric layer, and overlapping the disconnection region.

20 Claims, 29 Drawing Sheets

BULK ACOUSTIC WAVE FILTER HAVING RELEASE HOLE AND FABRICATING METHOD OF THE SAME

FIELD OF THE DISCLOSURE

The present disclosure relates to the field of semiconductor devices and, in particular, to a bulk acoustic wave filter having at least one release hole and a method of fabricating the filter.

BACKGROUND

A bulk acoustic resonator is a device including a thin film that is made of a piezoelectric material and disposed between two electrodes. The bulk acoustic resonator device is typically fabricated using semiconductor micro-processing technology.

Due to its small thickness, the bulk acoustic resonator device may be used in applications requiring high frequency, small size, and light weight. An exemplary application of the bulk acoustic resonator device is a bulk acoustic resonator filter used in mobile communication devices.

A bulk acoustic wave filter may include two or more bulk acoustic wave resonators. It is desirable to form a bulk acoustic wave filter having a smaller size.

SUMMARY

According to one aspect of the disclosure, a bulk acoustic wave filter is provided. The bulk acoustic wave filter includes: a first bulk acoustic wave resonator including, in an order from bottom to top, a first cavity, a first bottom electrode, a first segment of a piezoelectric layer, and a first top electrode; a second bulk acoustic wave resonator disposed adjacent to the first bulk acoustic wave resonator, and including, in the order from bottom to top, a second cavity, a second bottom electrode, a second segment of the piezoelectric layer, and a second top electrode; a boundary structure surrounding the first cavity and the second cavity, the boundary structure including a boundary portion extending between and separating the first cavity and the second cavity, and the boundary portion being disconnected at a disconnection region; and a first release hole formed in the piezoelectric layer, and overlapping the disconnection region.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
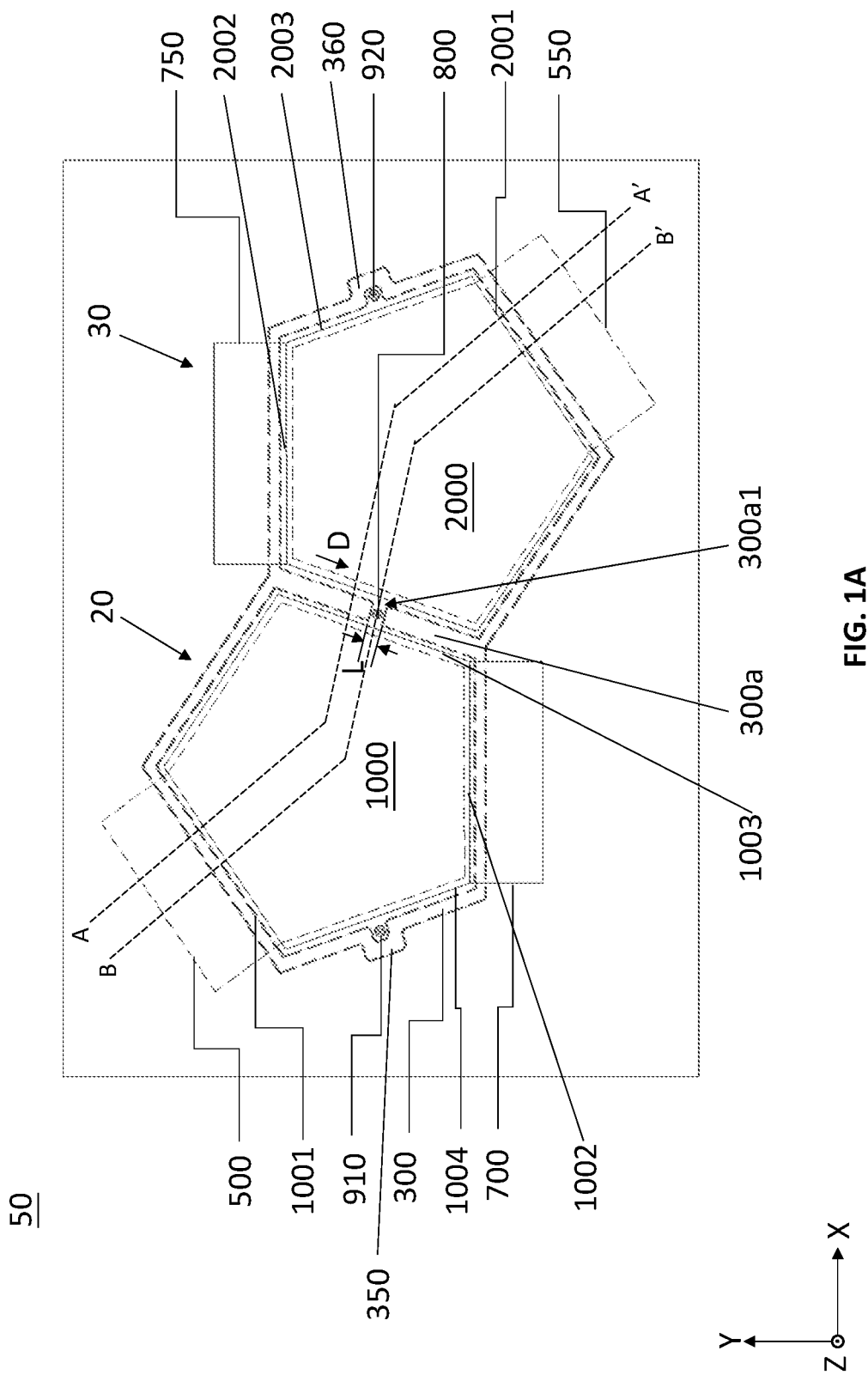
FIG. 1A is a top view of a bulk acoustic wave filter according to an embodiment of the present disclosure, showing cross-sectional lines A-A' and B-B' on the bulk acoustic wave filter.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Figure 1B:
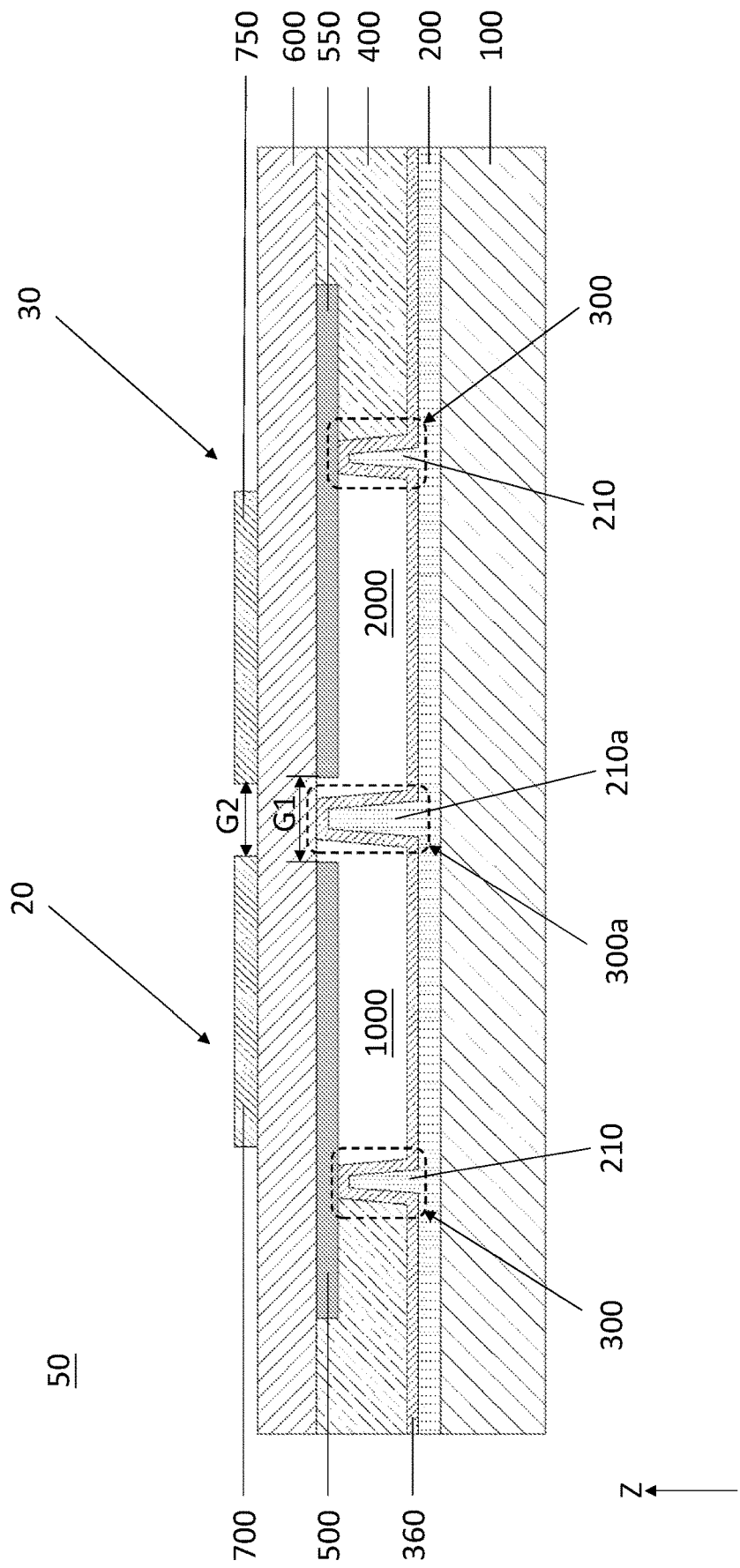
FIG. 1B is a cross-sectionally view of the bulk acoustic wave filter of FIG. 1A, along cross-sectional line A-A'.
Figure 1C:
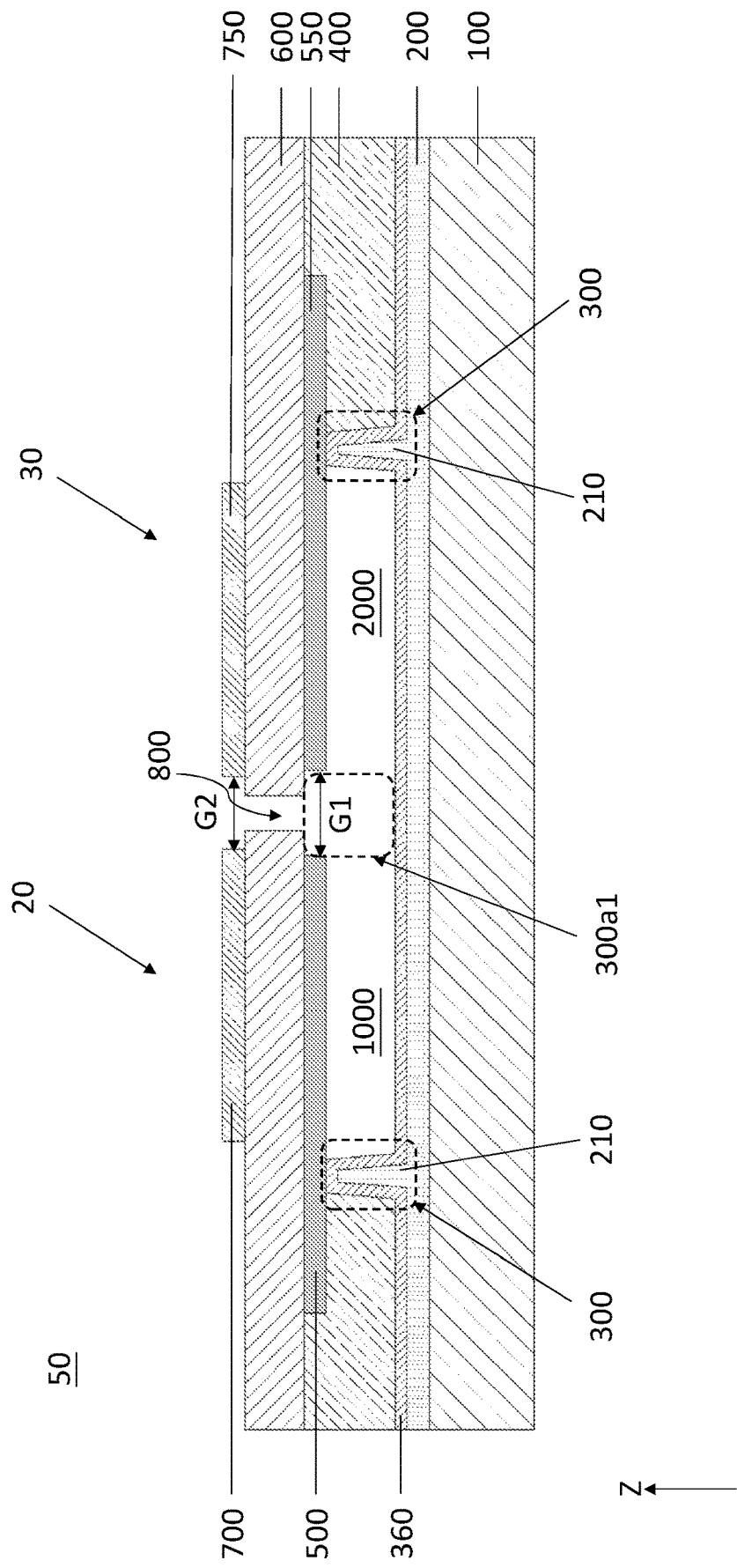
FIG. 1C is a cross-sectionally view of the bulk acoustic wave filter of FIG. 1A, along cross-sectional line B-B'.

FIG. 1A is a top view of a bulk acoustic wave filter 50 according to an embodiment of the present disclosure, showing cross-sectional lines A-A' and B-B'. FIG. 1B is a cross-sectionally view of bulk acoustic wave filter 50 of FIG. 1A, along cross-sectional line A-A' in FIG. 1A. FIG. 1C is a cross-sectionally view of bulk acoustic wave filter 50 of FIG. 1A, along cross-sectional line B-B' in FIG. 1A.

As illustrated in FIGS. 1A, 1B, and 1C, bulk acoustic wave filter 50 includes a first bulk acoustic wave resonator 20 and a second bulk acoustic wave resonator 30 located adjacent to each other. First bulk acoustic wave resonator 20 includes, in an order from bottom to top along a direction (the Z-axis direction in FIG. 1A) crossing a plane parallel to a major surface of bulk acoustic wave filter 50 (the X-Y plane in FIG. 1A), a first cavity 1000, a first bottom electrode 500, a first segment of a piezoelectric layer 600, and a first top electrode 700. First top electrode 500 partially overlaps first cavity 1000 and extends across a first side 1001 of first cavity 1000. That is, first bottom electrode 500 does not completely cross all of the sides of first cavity 1000. First top electrode 700 partially overlaps first cavity 1000, and extends across a second side 1002 of first cavity 1000. That is, first top electrode 700 does not completely cross all of the sides of first cavity 1000. Second bulk acoustic wave resonator 30 includes, in the order from bottom to top along the Z-axis direction, a second cavity 2000, a second bottom electrode 550, a second segment of the piezoelectric layer 600, and a second top electrode 750. Second bottom electrode 550 partially overlaps second cavity 2000 and extends across a first side 2001 of second cavity 2000. That is, second bottom electrode 550 does not completely cross all of the sides of second cavity 2000. Second top electrode 750 partially overlap second cavity 2000, and extends across a second side 2002 of second cavity 2000. That is, second top electrode 750 does not completely cross all of the sides of second cavity 2000.

Each of first cavity 1000 and second cavity 2000 has a polygon shape with more than three sides in the X-Y plane. For example, each of first cavity 1000 and second cavity 2000 may be a rectangle, a pentagon, a hexagon, etc. In the embodiment illustrated in FIG. 1, each of first cavity 1000 and second cavity 2000 is a pentagon. A third side 1003 of first cavity 1000 is shared with second cavity 2000.

In bulk acoustic wave filter 50, first bulk acoustic wave resonator 20 and second bulk acoustic wave resonator 30 are independent from each other. That is, first bottom electrode 500 of first bulk acoustic wave resonator 20 is separated from second bottom electrode 550 of second bulk acoustic wave resonator 30 with a first gap G1 therebetween (illustrated in FIGS. 1B and 1C), and first top electrode 700 of first bulk acoustic wave resonator 20 is separated from second top electrode 750 of second bulk acoustic wave resonator 30 with a second gap G2 therebetween (illustrated in FIGS. 1B and 1C).

Bulk acoustic wave filter 50 also includes a boundary structure 300 surrounding first cavity 1000 and second cavity 2000. Boundary structure 300 including a boundary portion 300a extending between and separating first cavity 1000 and second cavity 2000. In other words, boundary portion 300a extends along third side 1003 shared by first cavity 1000 and second cavity 2000. Boundary portion 300a is disconnected at a disconnection region 300a1 located between first cavity 1000 and second cavity 2000.

Bulk acoustic wave filter 50 further includes a first release hole 800 formed in piezoelectric layer 600, and overlapping disconnection region 300a1, first gap G1 between first bottom electrode 500 and second bottom electrode 550, and second gap G2 between first top electrode 700 and second top electrode 750. First release hole 800 is used for releasing an etching solution and/or etching product in a release etching process for forming first cavity 1000 and second cavity 2000. A length L of disconnection region 300a1 along an extending direction of the boundary portion 300a (direction D in FIG. 1A) is slightly greater than a diameter of first release hole 800. For example, length L of disconnection region 300a1 may range from approximately 5 μm to approximately 30 μm, and the diameter of first release hole 800 may range from approximately 5 μm to approximately 10 μm. If length L is less than the diameter of first release hole 800, the etching solution and the etching product may not be easily released through first release hole 850. If length L is greater than 30 μm, first and second acoustic wave resonators 20 and 30 may interfere with each other. In addition, both of a lateral width of first gap G1 along the X-Y plane and a lateral width of second gap G2 along the X-Y plane are greater than the diameter of first release hole 800.

Bulk acoustic wave filter 50 may further include at least one release hole adjacent to a side of first cavity 1000 or second cavity 2000. For example, as illustrated in FIG. 1A, bulk acoustic wave filter 50 includes a second release hole 910 located adjacent to a fourth side 1004 of first cavity 1000 that is different from first side 1001, second side 1002, and third side 1003, and a third release hole 920 located adjacent to a third side 2003 of second cavity 2000 that is different from first side 2001, second side 2002, and the side that is shared with first cavity 1000 (i.e., third side 1003 of first cavity 1000).

Boundary structure 300 includes a first protrusion 350 and a second protrusion 360 protruding away from first and second bottom electrodes 500 and 550, and first and second top electrodes 700 and 750 in the X-Y plane. Second release hole 910 is located adjacent to, and partially surrounded by first protrusion 350. Third release hole 920 is located adjacent to, and partially surrounded by second protrusion 360.

As illustrated in FIGS. 1B and 1C, bulk acoustic wave filter 50 further includes a substrate 100, and a support layer 400 disposed on substrate 100 and includes first cavity 1000 and second cavity 2000. Substrate 100 is formed of Si, glass, SiC, sapphire ($Al_2O_3$), or GaN. Support layer 400 is formed of $SiO_2$. Piezoelectric layer 600 is disposed on support layer 400, covering first cavity 1000 and second cavity 2000. First bottom electrode 500 and second bottom electrode 550 are disposed below piezoelectric layer 600. First top electrode 700 and second top electrode 750 are disposed above piezoelectric layer 600. First release hole 800 is formed in and penetrating piezoelectric layer 600.

Bulk acoustic wave filter 50 further includes a bonding layer 200 disposed between substrate 100 and support layer 400. Bonding layer 200 includes protruding structure 210 protruding towards piezoelectric layer 600 along the Z-axis direction. When viewing from a top of bulk acoustic wave filter 50, protruding structure 210 is formed as two rings that surround first cavity 1000 and second cavity 2000, respectively. As illustrated in FIG. 1B, which is the cross-sectionally view of bulk acoustic wave filter 50 of FIG. 1A, along cross-sectional line A-A', protruding structure 210 includes a portion 210a disposed between first cavity 1000 and second cavity 2000.

A boundary layer 360 overlies bonding layer 200, covering the upper surface of bonding layer 200 and side surfaces of protruding structure 210 that surrounds cavity 1000 and second cavity 2000. Thus, boundary layer 360 defines the bottoms and sidewalls of first cavity 1000 and second cavity 2000. Boundary layer 360 is formed of SiN, AlN, polysilicon, amorphous silicon or a stacked combination of two or more of those materials. Bonding layer 200 is formed of $SiO_2$ for bonding substrate 100 and boundary layer 360.

Protruding structure 210 and the portions of boundary layer 360 formed on the side surfaces of protruding structure 210 constitute boundary structure 300 that surrounds first cavity 1000 and second cavity 2000. Boundary structure 300 has a double-wall structure with the bonding material formed between two sidewalls, which are provided by the portions of boundary layer 360 formed on the side surfaces of protruding structure 210. Boundary structure 300 having the double-wall structure is formed with a predetermined thickness. A top of boundary structure 300 is connected to bottom electrode 500 or 550, or piezoelectric layer 600.

Boundary structure 300 includes boundary portion 300a that extends between, and separates, first cavity 1000 and second cavity 2000. Boundary portion 300a is disposed along the shared side 1003 between first cavity 1000 and second cavity 2000. A top of boundary portion 300a is connected to piezoelectric layer 600.

In bulk acoustic wave filter 50, the two resonators 20 and 30 are arranged to be adjacent to each other, and first release hole 800 is arranged in an area between the two resonators 20 and 30. Therefore, the need for forming release holes in other regions of bulk acoustic wave filter 50 is reduced or no longer required, so that the chip area and chip manufacturing cost can be reduced.

Figure 2A:
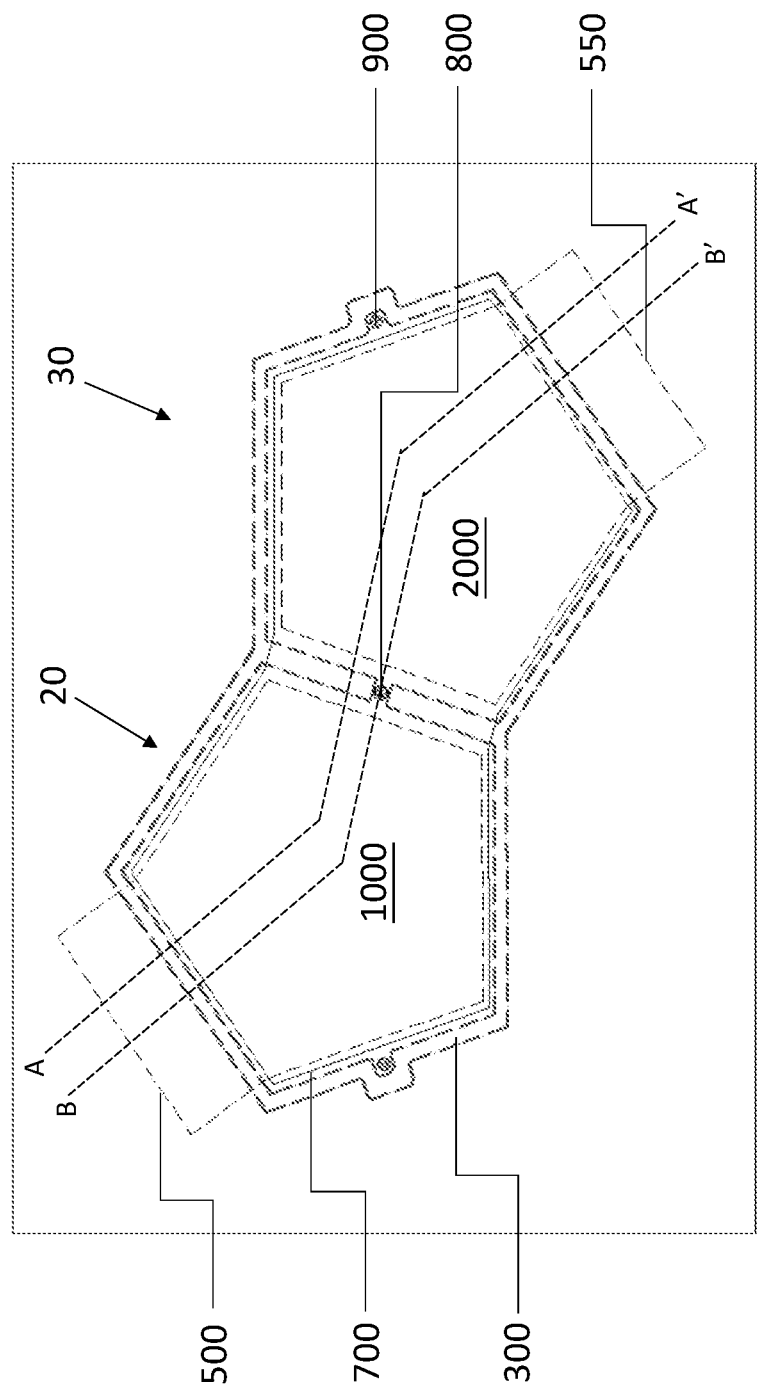
FIG. 2A is a top view of a bulk acoustic wave filter according to an embodiment of the present disclosure, showing cross-sectional lines A-A' and B-B' on the bulk acoustic wave filter.
Figure 2B:
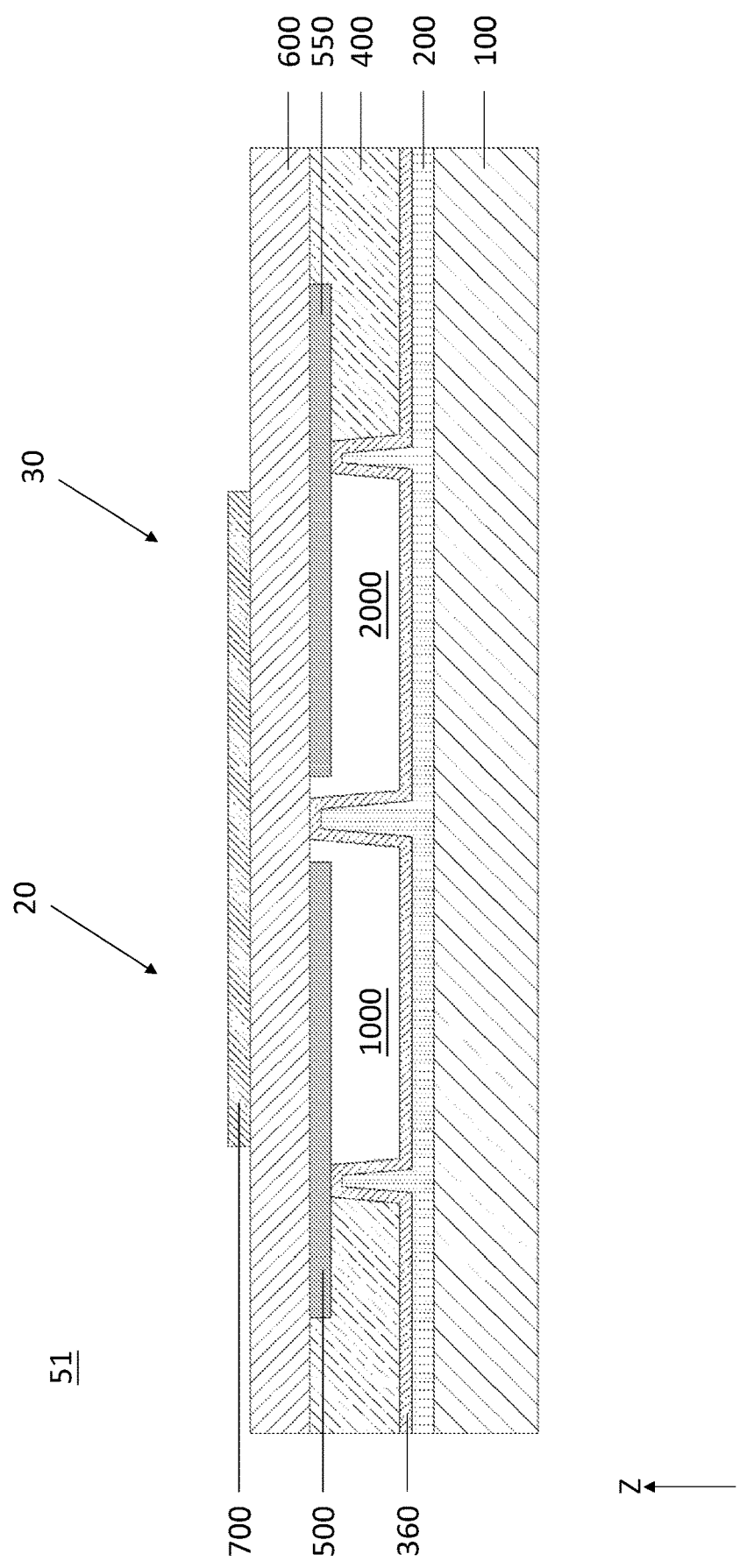
FIG. 2B is a cross-sectionally view of the bulk acoustic wave filter of FIG. 2A, along cross-sectional line A-A'.
Figure 2C:
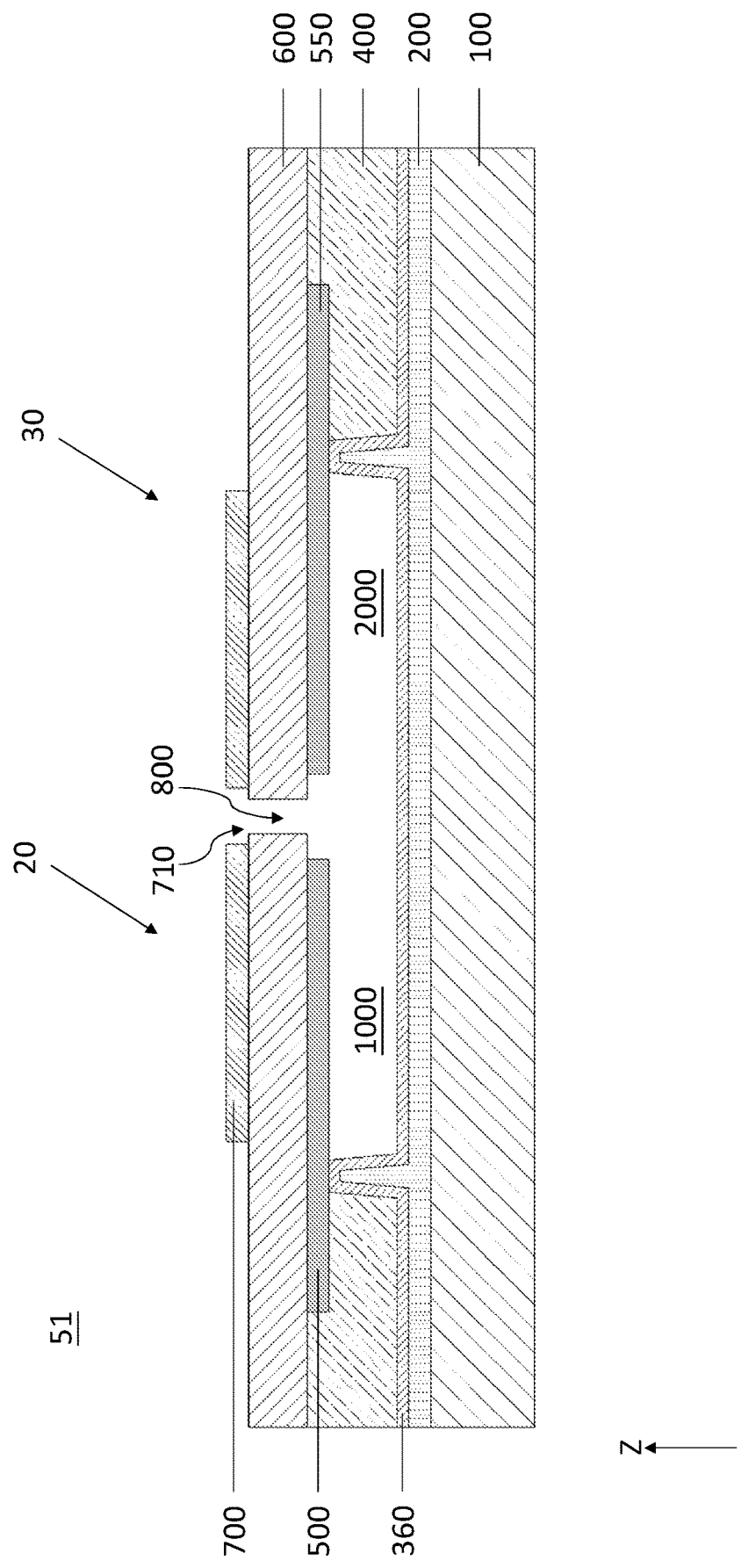
FIG. 2C is a cross-sectionally view of the bulk acoustic wave filter of FIG. 2A, along cross-sectional line B-B'.

FIG. 2A is a top view of a bulk acoustic wave filter 51 according to an embodiment of the present disclosure. FIG. 2B is a cross-sectionally view of bulk acoustic wave filter 51 of FIG. 2A, along cross-sectional line A-A' in FIG. 2A. FIG. 2C is a cross-sectionally view of bulk acoustic wave filter 51 of FIG. 2A, along cross-sectional line B-B' in FIG. 2A.

Bulk acoustic wave filter 51 differs from bulk acoustic wave filter 50 in that first bulk acoustic wave resonator 20 and second bulk acoustic wave resonator 30 are connected in series. That is, first bulk acoustic wave resonator 20 and second bulk acoustic wave resonator 30 share the same top electrode 700. In other words, the first top electrode of first bulk acoustic wave resonator 20 is integrally formed with the second top electrode of second bulk acoustic wave resonator 30 to constitute top electrode 700. Top electrode 700 partially overlaps both of first cavity 1000 and second cavity 2000, and boundary portion 300a between first cavity 1000 and second cavity 200.

As illustrated in FIG. 2C, a top opening 710 is formed in top electrode 700, and overlaps first release hole 800. A lateral diameter of top opening 710 along the X-Y plane is greater than the lateral diameter of first release hole 800 along the X-Y plane. As a result, the etching solution and the etching products of the release etching process may be easily released via first release hole 800.

Except for top electrode 700, the components and structure of bulk acoustic wave filter 51 are the same as those of bulk acoustic wave filter 50, and therefore detailed descriptions of these components are not repeated.

Figure 3A:
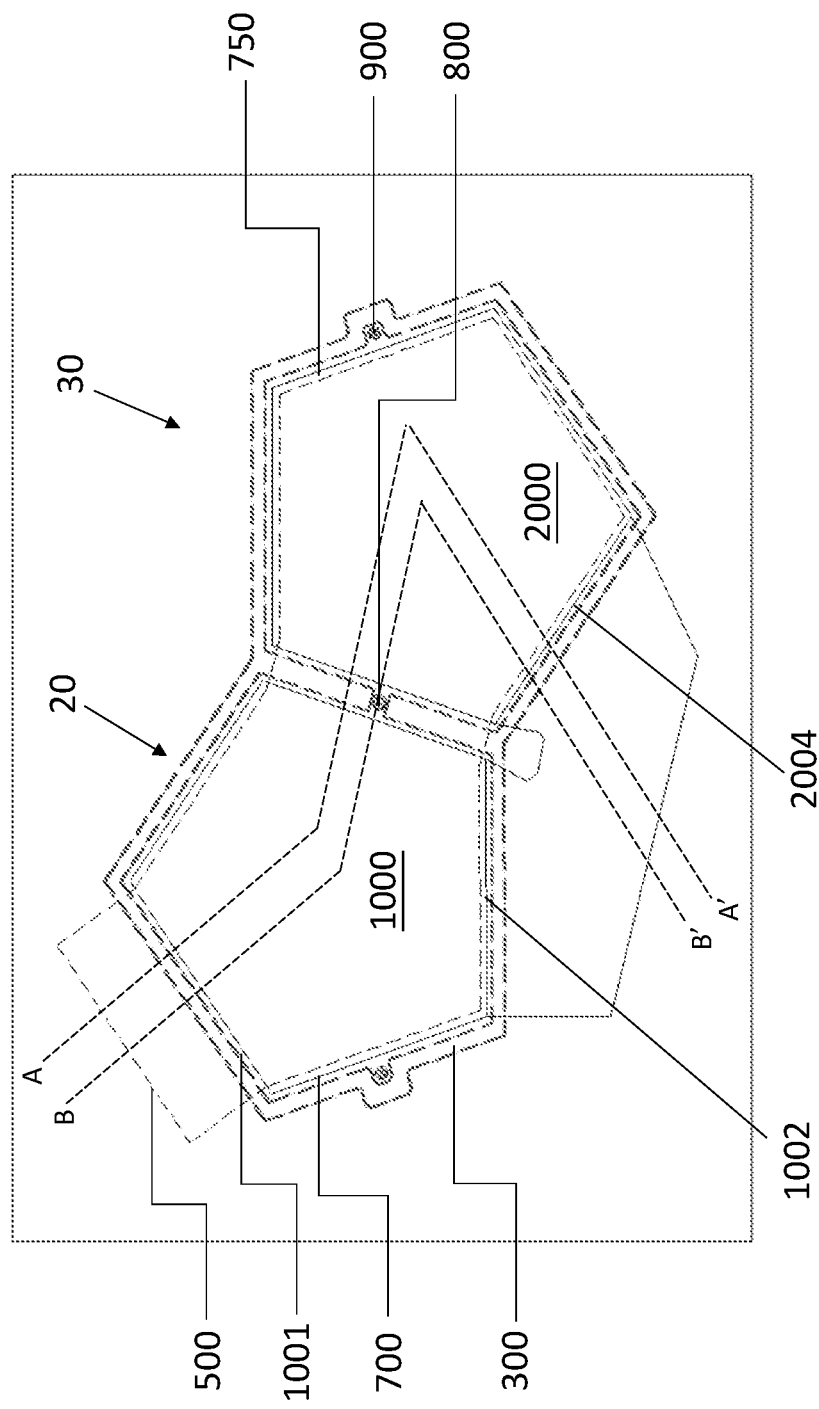
FIG. 3A is a top view of a bulk acoustic wave filter according to an embodiment of the present disclosure, showing cross-sectional lines A-A' and B-B' on the bulk acoustic wave filter.
Figure 3B:
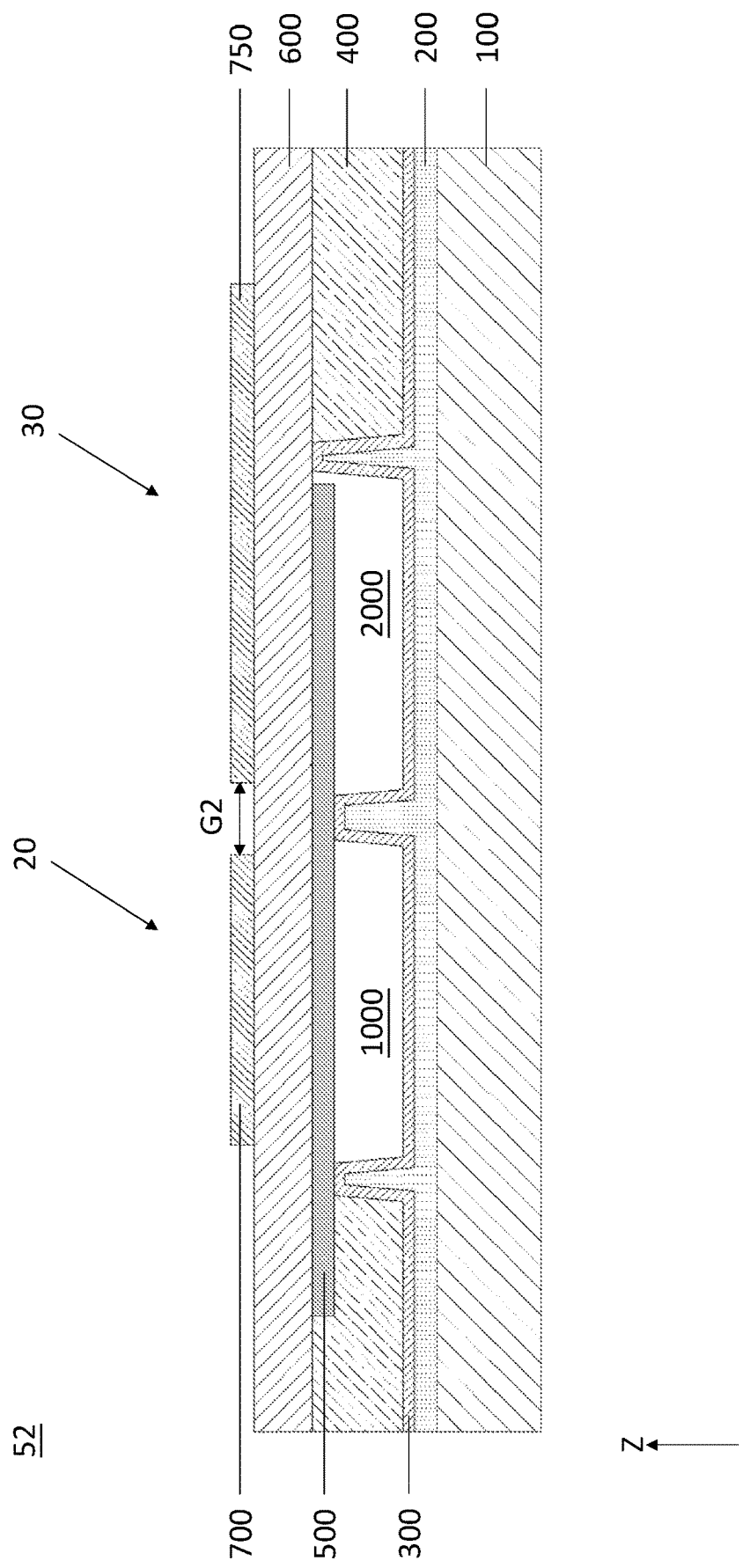
FIG. 3B is a cross-sectionally view of the bulk acoustic wave filter of FIG. 3A, along cross-sectional line A-A'.
Figure 3C:
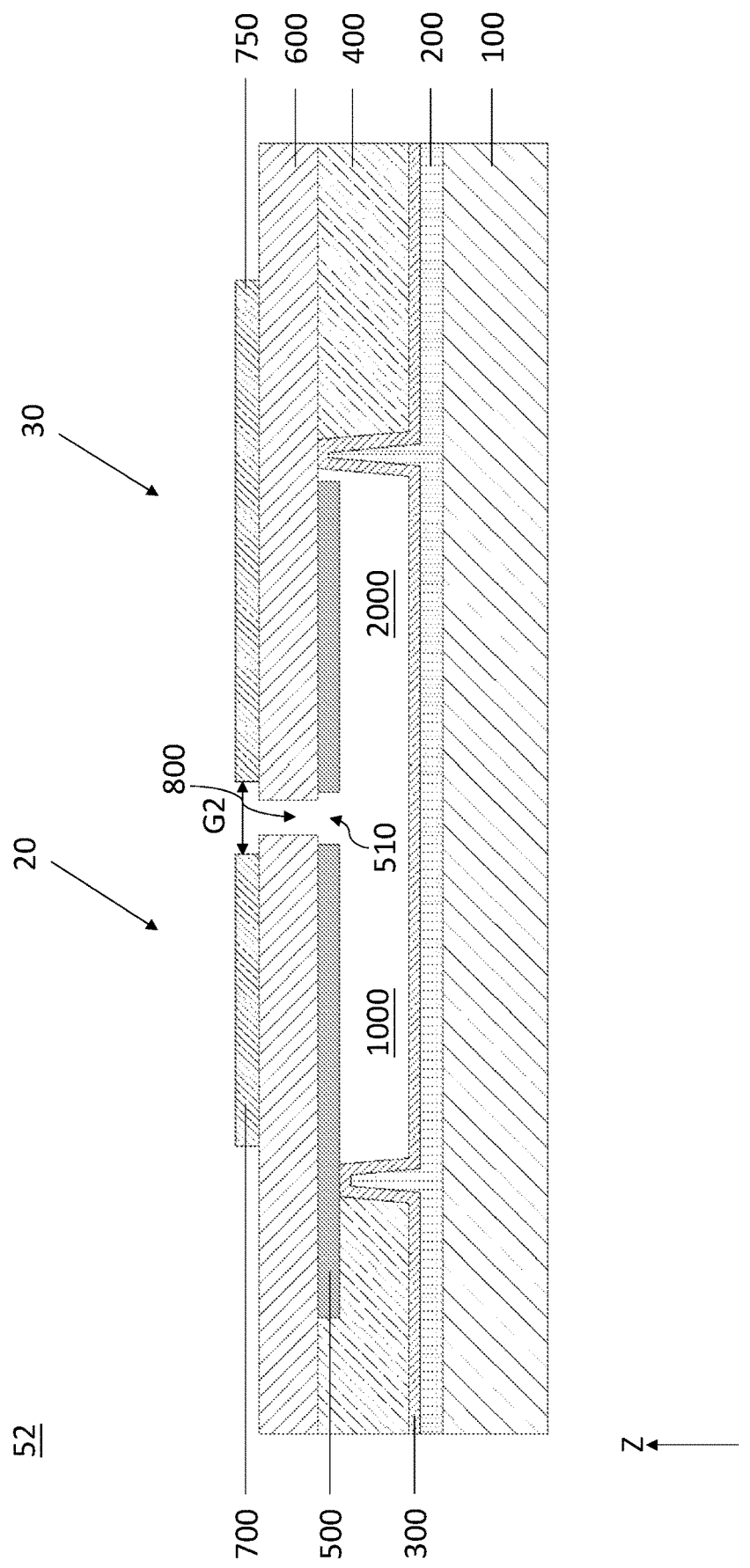
FIG. 3C is a cross-sectionally view of the bulk acoustic wave filter of FIG. 3A, along cross-sectional line B-B'.

FIG. 3A is a top view of a bulk acoustic wave filter 52 according to an embodiment of the present disclosure. FIG. 3B is a cross-sectionally view of bulk acoustic wave filter 52 of FIG. 3A, along cross-sectional line A-A' in FIG. 3A. FIG. 3C is a cross-sectionally view of bulk acoustic wave filter 52 of FIG. 3A, along cross-sectional line B-B' in FIG. 3A.

Bulk acoustic wave filter 52 differs from bulk acoustic wave filter 50 in that first bulk acoustic wave resonator 20 and second bulk acoustic wave resonator 30 are connected in parallel. That is, first bulk acoustic wave resonator 20 and second bulk acoustic wave resonator 30 share the same bottom electrode 500. In other words, the first bottom electrode of first bulk acoustic wave resonator 20 is integrally formed with the second bottom electrode of second bulk acoustic wave resonator 30 to constitute bottom electrode 500. Bottom electrode 500 partially overlaps both of first cavity 1000 and second cavity 200, and boundary portion 300a between first cavity 1000 and second cavity 200. Bottom electrode 500 extends across first side 1001 of first cavity 1000. First top electrode 700 partially overlaps first cavity 1000, and extends across second side 1002 of first cavity 1000. Second top electrode 750 partially overlaps second cavity 2000, and extends across fourth side 2004 of second cavity 2000. Second gap G2 exists between first top electrode 700 and second top electrode 750. First top electrode 700 and second top electrode 750 are connected to each other at a region external to first cavity 1000 and second cavity 2000.

As illustrated in FIG. 3C, a bottom opening 510 is formed in bottom electrode 500, and overlaps first release hole 800. A lateral diameter of bottom opening 510 along the X-Y plane is greater than the lateral diameter of first release hole 800 along the X-Y plane. As a result, the etching solution and the etching products of the release etching process may be easily released via first release hole 800.

Except for bottom electrode 500, the components and structure of bulk acoustic wave filter 52 are the same as those of bulk acoustic wave filter 50, and therefore detailed descriptions of these components are not repeated.

FIGS. 4, 5, 6A, 6B, 7A, 7B, 8A, 8B, 9A, 9B, 10A, 10B, 11A, 11B, 12A, 12B, 13A, 13B, 14A, and 14B show cross-sectional views of structures formed in a process of fabricating bulk acoustic wave filter 52, according to embodiments of the present disclosure. Of these figures, FIGS. 6A-14A are cross-sectional views of the structures along cross-sectional line A-A' on bulk acoustic wave filter 52 illustrated in FIG. 3A, and FIGS. 6B-14B are cross-sectional views of the structures along cross-sectional line B-B' on bulk acoustic wave filter 52 illustrated in FIG. 3A.

Figure 4:
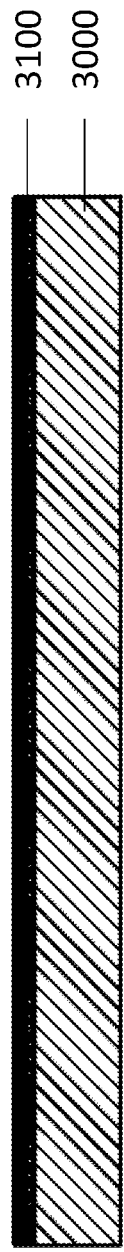
FIGS. 4, 5, 6A, 6B, 7A, 7B, 8A, 8B, 9A, 9B, 10A, 10B, 11A, 11B, 12A, 12B, 13A, 13B, 14A, and 14B show cross-sectional views of structures formed in a process of fabricating the bulk acoustic wave filter of FIG. 3A, according to embodiments of the present disclosure.

As illustrated in FIG. 4, a temporary substrate 3000 is obtained, and a silicon oxide layer 3100 is formed on temporary substrate 3000. Temporary substrate 3000 may include silicon (Si), silicon carbide (SiC), aluminum oxide, quartz, or glass, etc. Silicon oxide layer 3100 may be obtained by oxidizing a silicon substrate, or may be deposited on temporary substrate 3000 through a chemical vapor deposition (CVD) process. In the present embodiment, temporary substrate 3000 includes silicon (Si).

Figure 5:
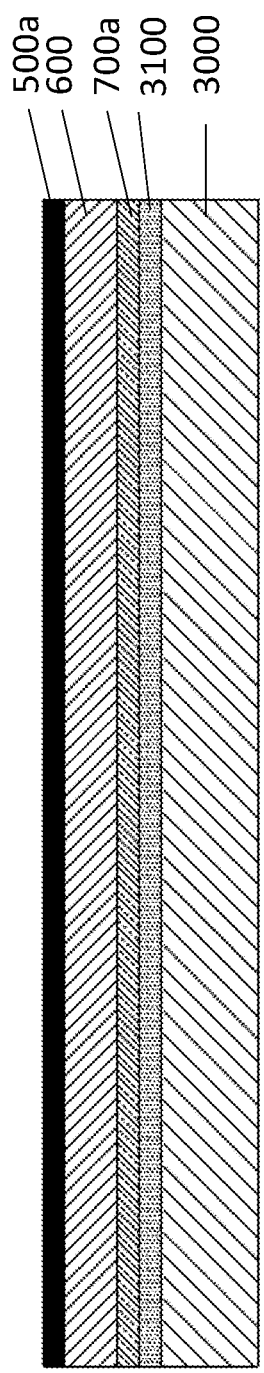

As illustrated in FIG. 5, a top electrode layer 700a, a piezoelectric layer 600, and a bottom electrode layer 500a are sequentially deposited on silicon oxide layer 3100. Top and bottom electrode layers 700a and 500a may include any suitable conductive material, such as various metal materials with conductive properties or a stack of several conductive metal materials, such as molybdenum (Mo), aluminum (Al), copper (Cu), platinum (Pt), tantalum (Ta), tungsten (W), palladium (Pd), ruthenium (Ru), etc. In the present embodiment, top and bottom electrode layers 700a and 500a include molybdenum (Mo). Piezoelectric layer 600 may include materials with piezoelectric properties or their stacked combination, such as aluminum nitride (AlN), zinc oxide (ZnO), lithium niobate (LiNbO$_3$), lithium tantalate (LiTaO$_3$), lead zirconate titanate (PZT), barium strontium titanate (BST), etc., or a stacked combination of two or more of these materials. When the material of piezoelectric layer 600 is aluminum nitride (AlN), the aluminum nitride itself may also be doped with a certain proportion of rare earth elements, such as scandium, erbium, lanthanum, etc. In the present embodiment, the material of the piezoelectric layer 600 includes aluminum nitride (AlN) or scandium doped aluminum nitride (ScAlN).

Figure 6A:
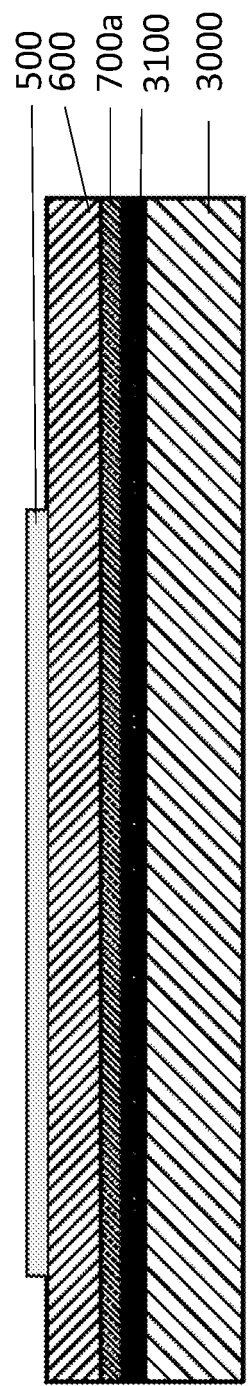
Figure 6B:
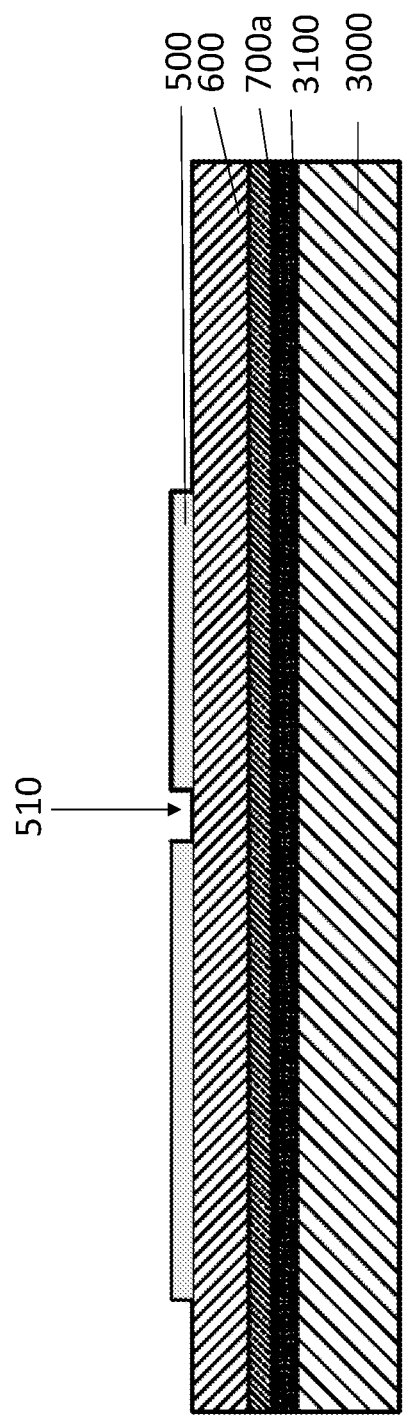

As illustrated in FIGS. 6A and 6B, bottom electrode layer 500a is patterned to form bottom electrode 500. As illustrated in FIG. 6B, bottom opening 510 is formed in bottom electrode 500 during the patterning of bottom electrode 500. The position of bottom opening 510 corresponds to the position of first release hole 800 to be formed. The patterning may be achieved by etching, such as a plasma etching process, a wet chemical etching process, or a combination of the two. As a result of the patterning, an accurate pattern of bottom electrode 500 may be realized.

Figure 7A:
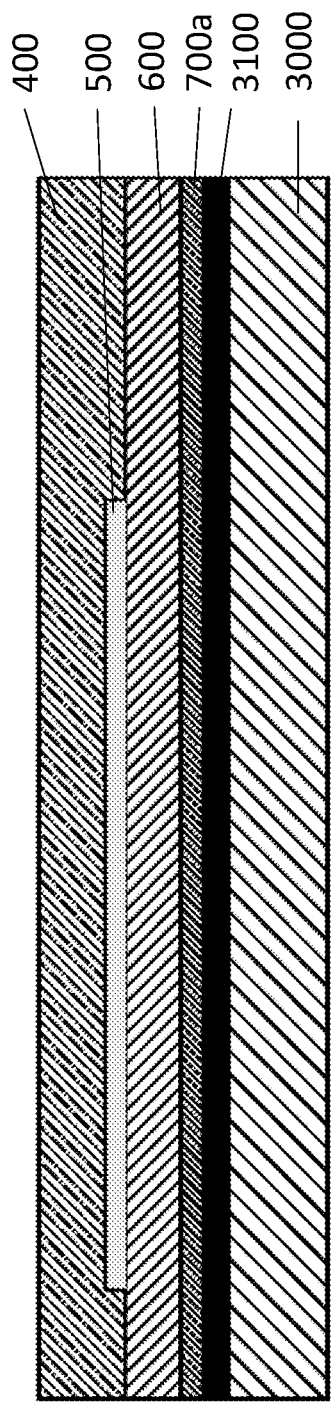
Figure 7B:
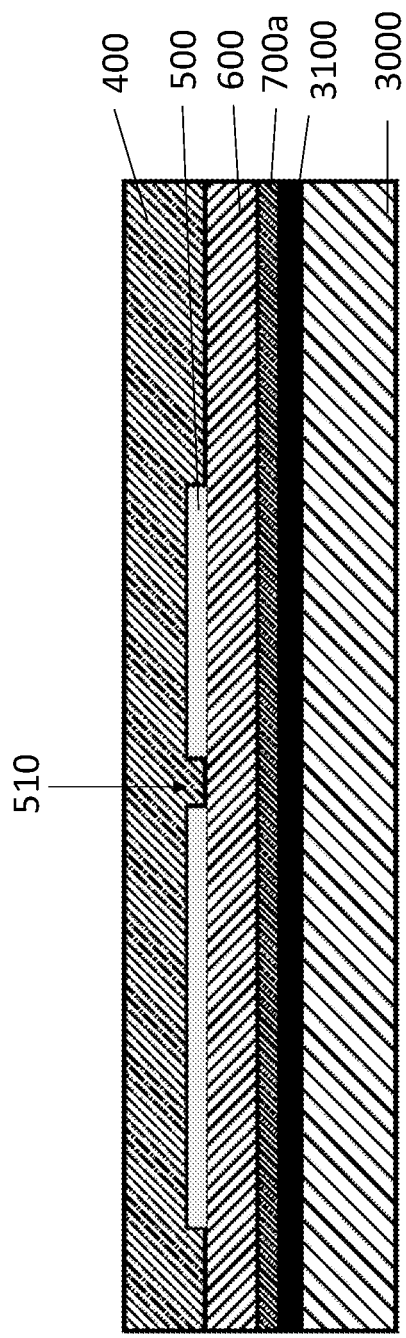

As illustrated in FIGS. 7A and 7B, a support layer 400 is deposited on the structure illustrated in FIGS. 6A and 6B. The material of support layer 400 may be silicon oxide. A part of support layer 400 will be removed during a subsequent release etching process, thereby forming first cavity 1000 and second cavity 2000.

Figure 8A:
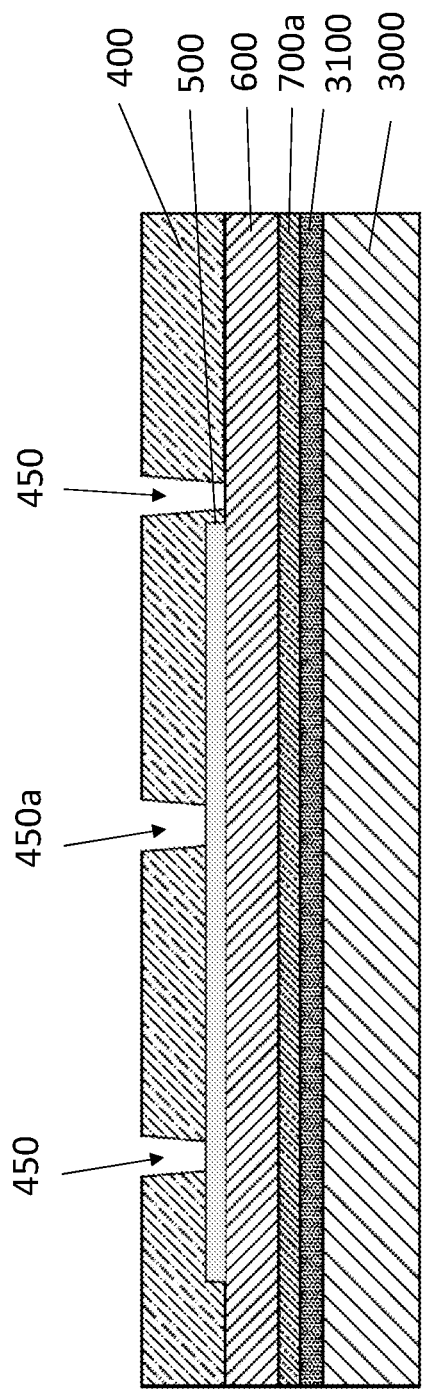
Figure 8B:
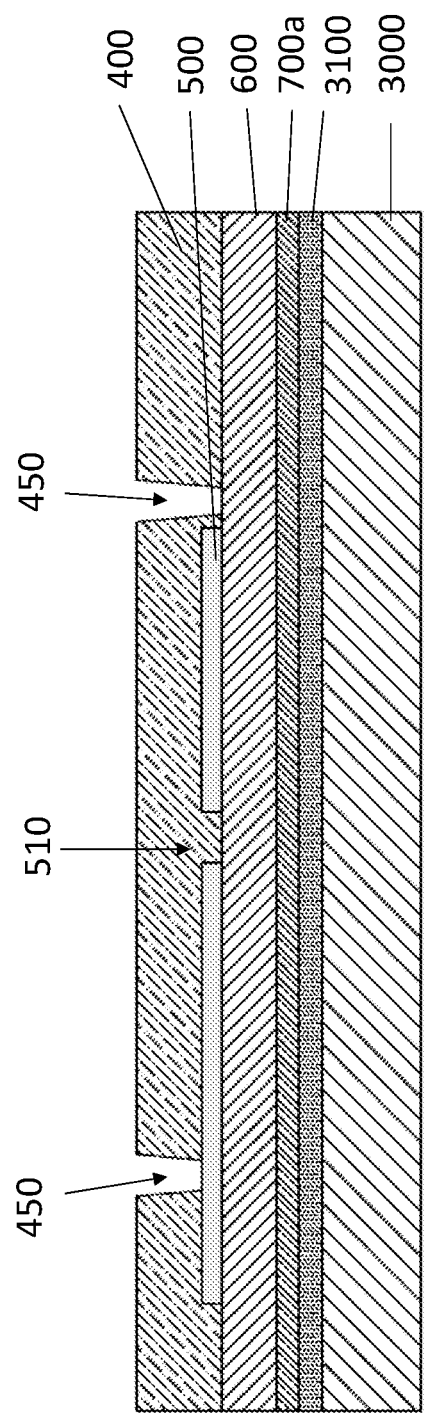

As illustrated in FIGS. 8A and 8B, support layer 400 is patterned by etching to form a trench 450 exposing either a portion of bottom electrode 500 or a portion of piezoelectric layer 600. Trench 450 has two ring shapes and is used to define the range of first cavity 1000 and second cavity 2000. As illustrated in FIG. 8A, a portion 450a of trench 450 exposes a portion of bottom electrode 500. Portion 450a is used to define a separation between first cavity 1000 and second cavity 2000.

Figure 9A:
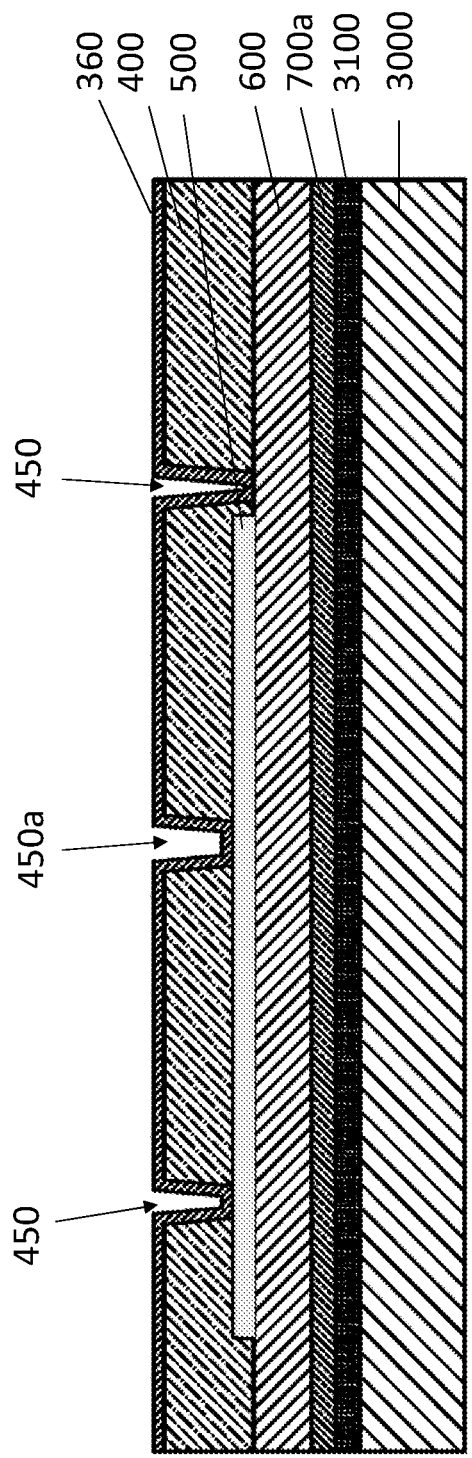
Figure 9B:
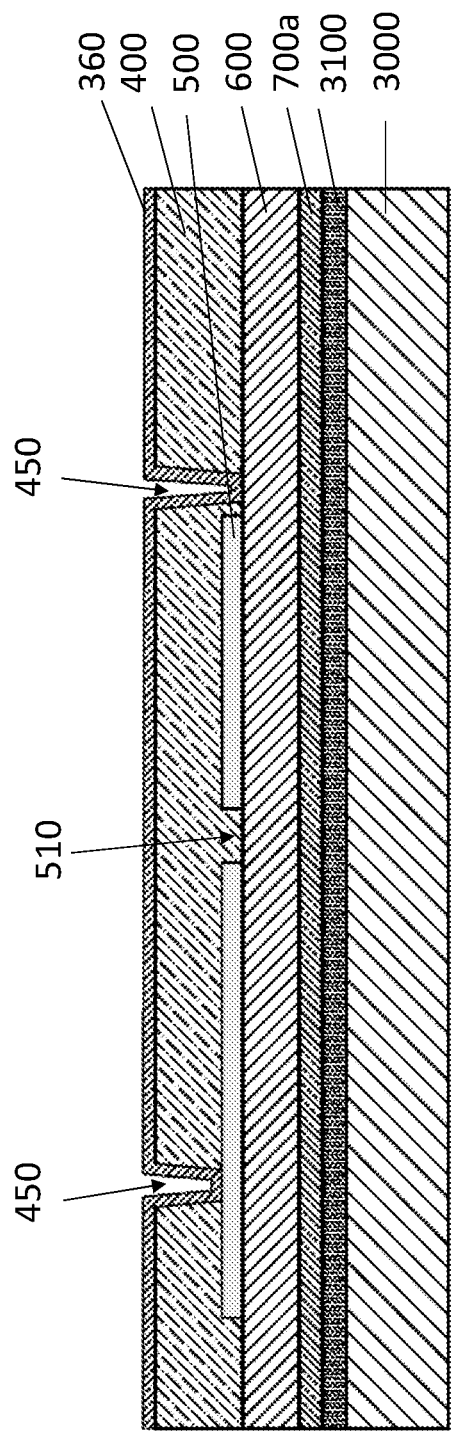

As illustrated in FIGS. 9A and 9B, boundary layer 360 is deposited on support layer 400, including sidewalls and bottom of trench 450. The material of boundary layer 360 may be silicon (Si), silicon nitride (SiN), aluminum nitride (AlN), or other non-conductive materials, or a stacked combination of two or more of these materials. Boundary layer 360 is deposited in trench 450, thereby defining a stop boundary during the subsequent release etching process of support layer 400 for defining first cavity 1000 and second cavity 2000. In the present embodiment, because the patterning of bottom electrode 500 is performed before first cavity 1000 and second cavity 2000 are defined, the patterning of bottom electrode 500 may be precisely controlled, thereby minimizing parasitic capacitance resulted from inaccurate patterning of bottom electrode 500.

Figure 10A:
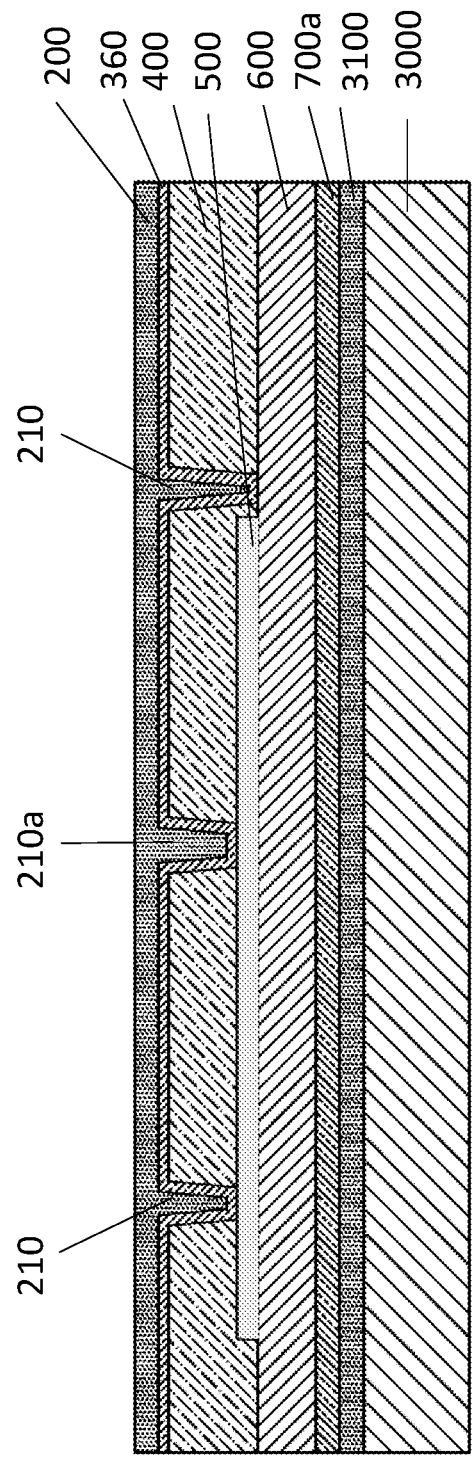
Figure 10B:
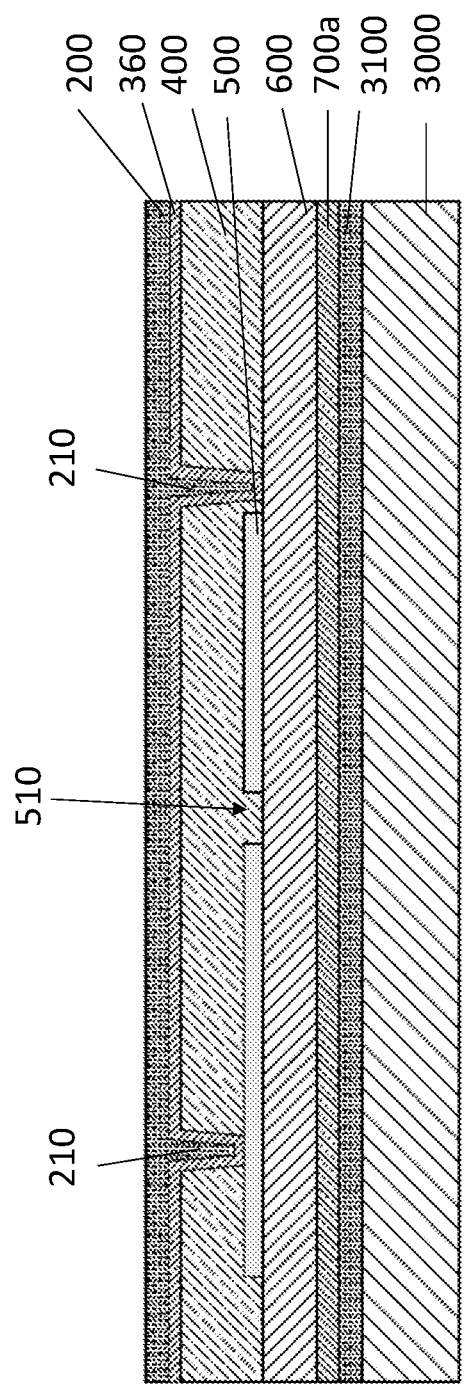

As illustrated in FIGS. 10A and 10B, bonding layer 200 is deposited on boundary layer 360, including the portion of boundary layer 360 deposited on the sidewalls and bottom of trench 450. Then, surface planarization and polishing are performed on bonding layer 200. The portion of the bonding layer 200 that is deposited on trench 450 form protruding structure 210 which, together with boundary layer 360, form boundary structure 300 that has the two ring shapes for defining the range of first cavity 1000 and second cavity 2000. As illustrated in FIG. 10A, protruding structure 210 includes a portion 210a to be extended between first cavity 1000 and second cavity 2000. Bonding layer 200 is used to bond substrate 100. The material of bonding layer 200 may be silicon oxide, silicon nitride, or other materials, or a stacked combination of two or more of these materials. In the present embodiment, silicon oxide is used for bonding layer 200. The surface planarization and polishing may be performed by a chemical mechanical polishing (CMP) process.

Figure 11A:
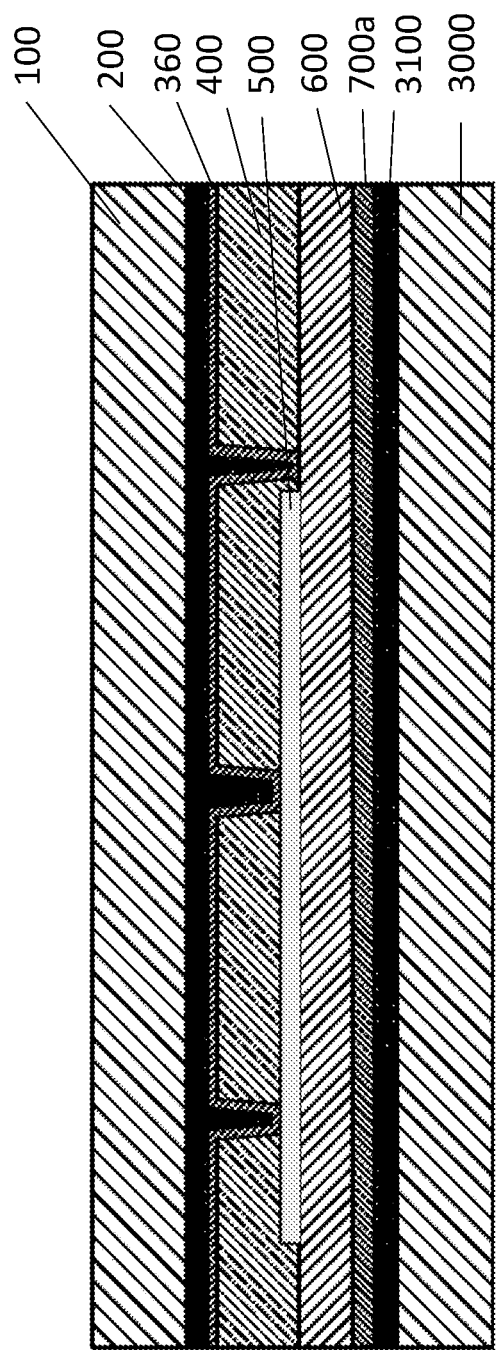
Figure 11B:
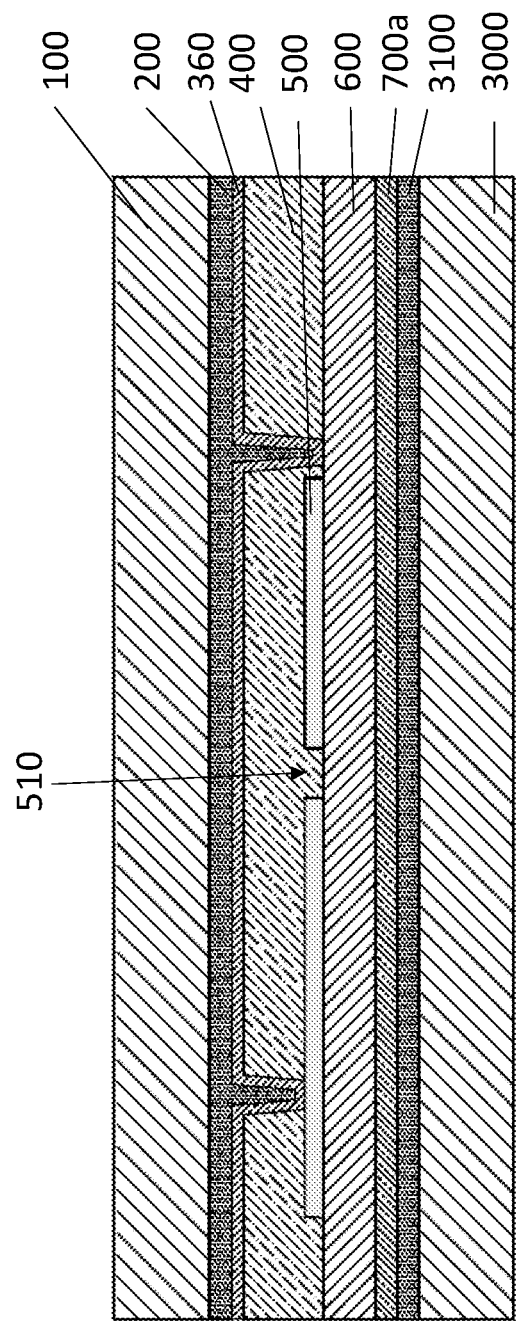

As illustrated in FIGS. 11A and 11B, substrate 100 is bonded to bonding layer 200. Substrate 100 may be a cap wafer that includes a material such as silicon (Si), carbon silicon (SiC), aluminum oxide, quartz, glass (SiO$_2$), or sapphire (Al$_2$O$_3$). In the present embodiment, substrate 100 includes silicon (Si).

Figure 12A:
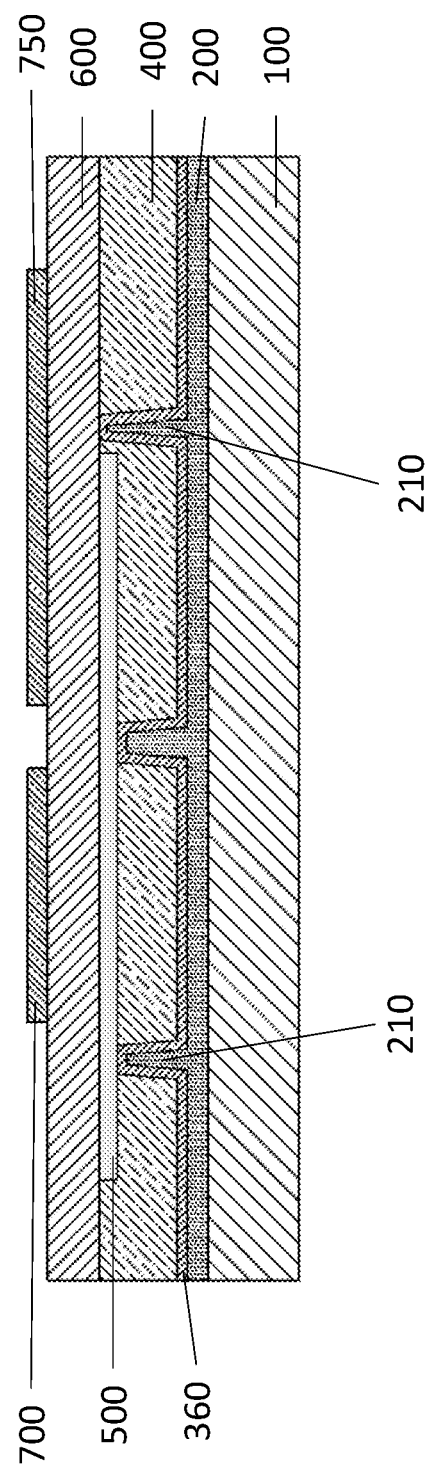
Figure 12B:
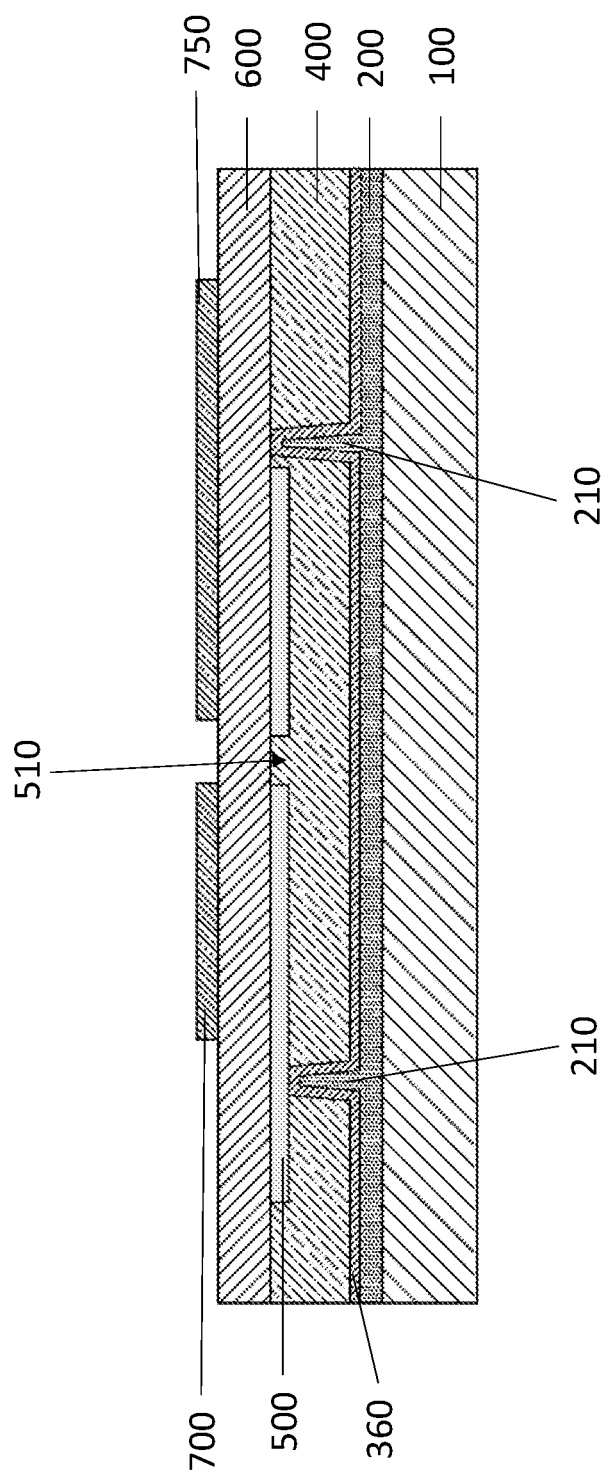

Then, the structure illustrated in FIGS. 11A and 11B is flipped over, and as illustrated in FIGS. 12A and 12B, temporary substrate 3000 and silicon oxide layer 3100 are removed. The removing of temporary substrate 3000 may be performed by a grinding process, a plasma dry etching process, a wet chemical etching process, or a combination thereof. In the present embodiment, temporary substrate 3000 is made of silicon material, and is removed by a combination of grinding and wet chemical etching, or a combination of grinding and plasma dry etching. Silicon oxide layer 3100 may be removed by plasma dry etching, wet chemical etching, or a combination of the two.

In addition, top electrode layer 700a is patterned by etching, to form first top electrode 700 and second top electrode 750 with gap G2 therebetween. The etching process may be a plasma etching process, a wet chemical etching process, or a combination of the two. This step allows for precise patterning of first top electrode 700 and second top electrode 750. In combination of the precise patterning of bottom electrode 500, parasitic capacitance may be minimized.

Figure 13A:
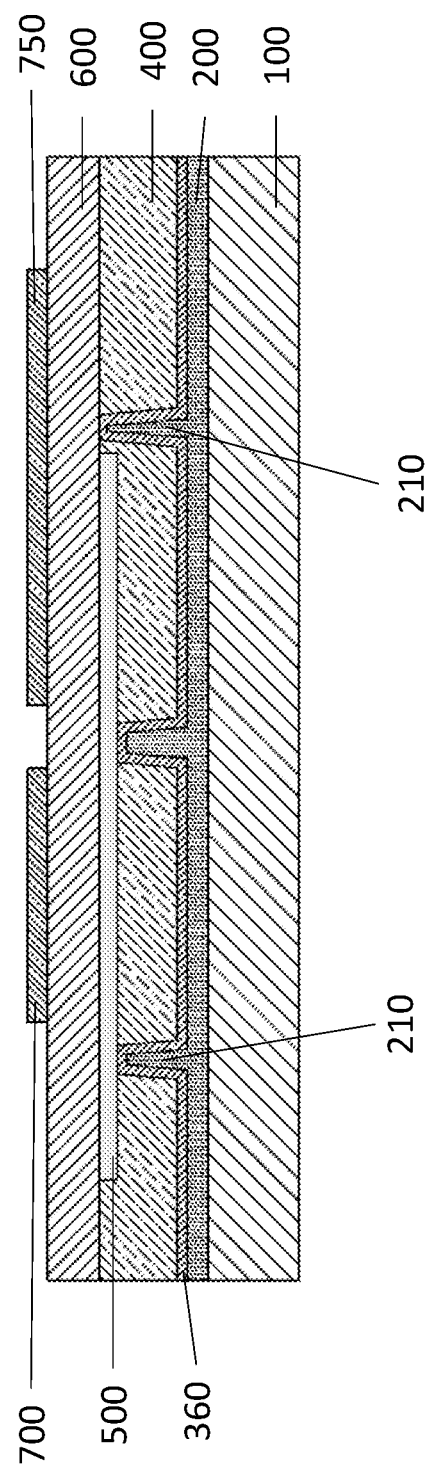
Figure 13B:
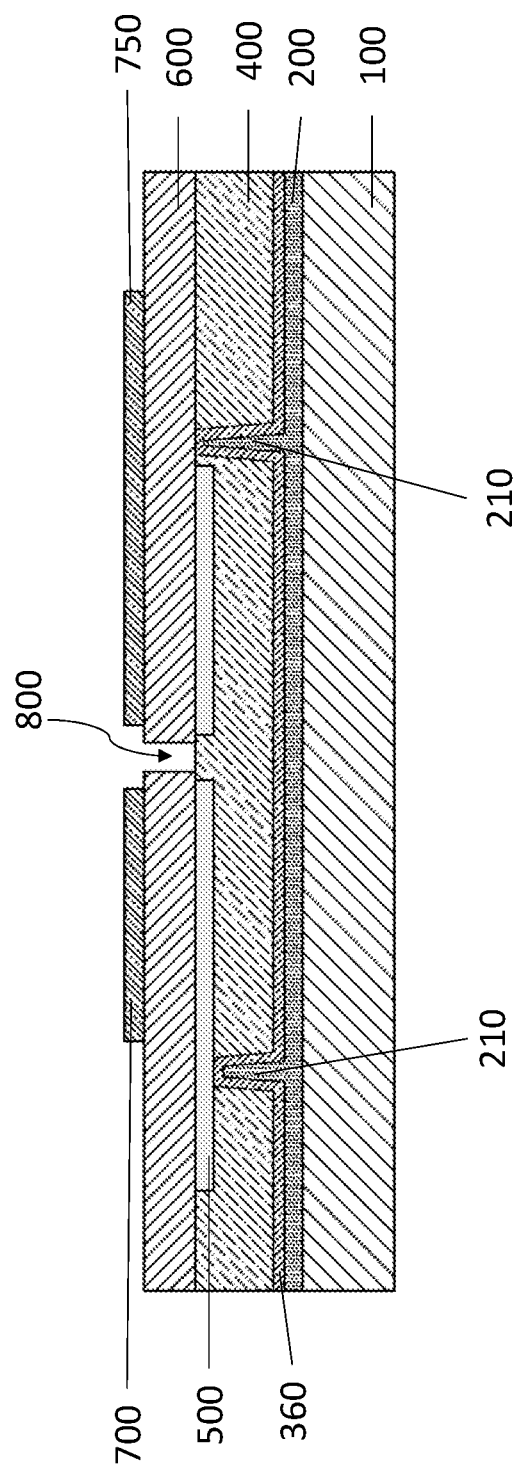

As illustrated in FIGS. 13A and 13B, a portion of piezoelectric layer 600 disposed above support layer 400 is etched to form first release hole 800 for removing a portion of support layer 400 to form first cavity 1000 and second cavity 2000.

Figure 14A:
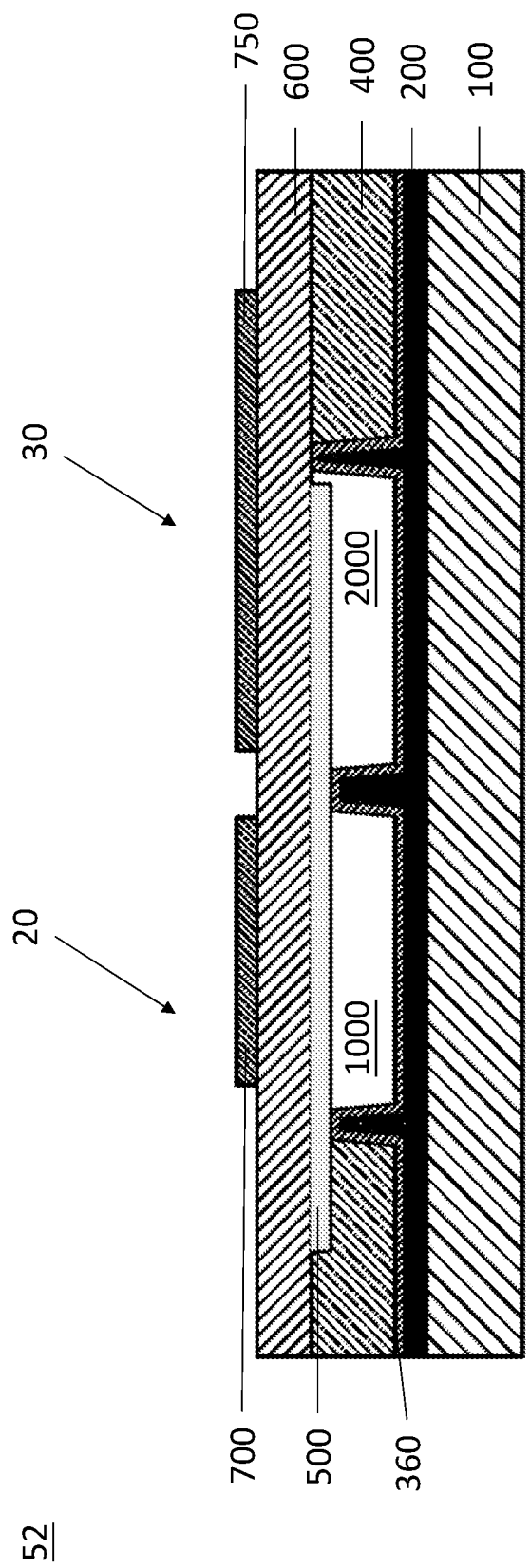
Figure 14B:
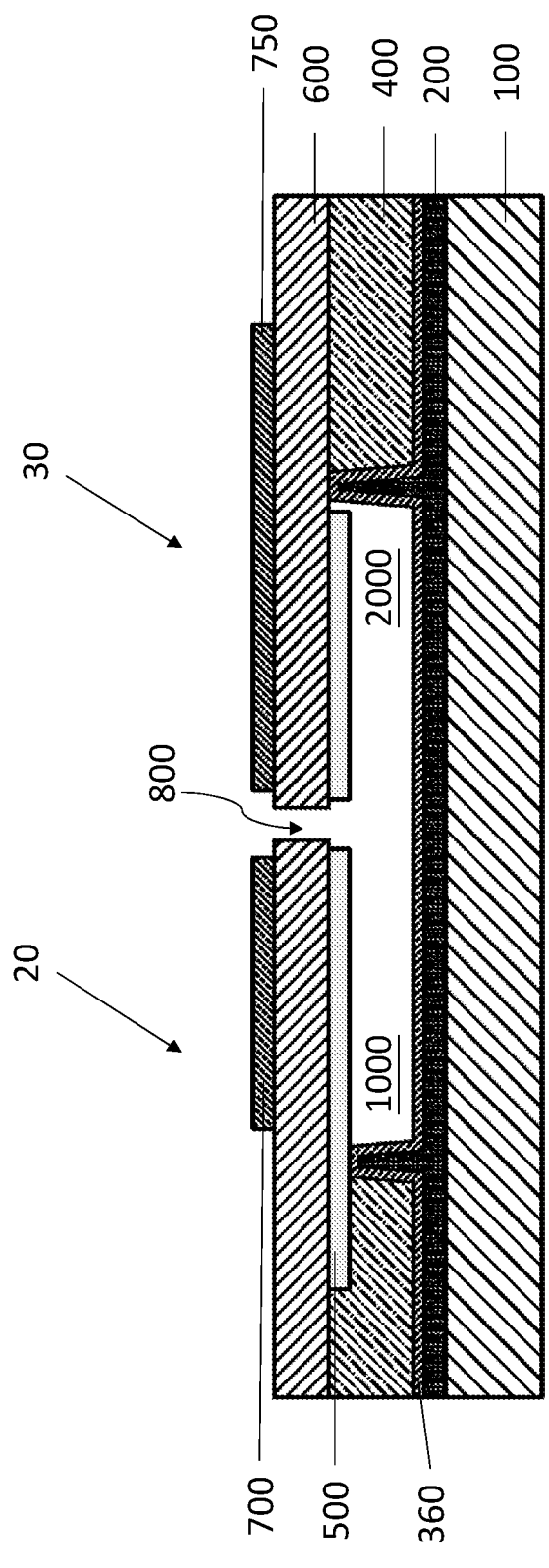

As illustrated in FIGS. 14A and 14B, support layer 400 is etched to form first cavity 1000 and second cavity 2000. In the present embodiment, support layer 400 is made from silicon oxide, and the etching and releasing process of support layer 400 may be performed by using hydrofluoric acid solution wet etching, buffered oxide etchant (BOE) solution wet etching, or hydrofluoric acid vapor corrosion, or a combination of these processes. During the etching process, the etching solution and the etching products are released through first release hole 800. The etching process stops at boundary layer 360. After forming first cavity 1000 and second cavity 2000, bulk acoustic wave filter 52 illustrated in FIGS. 3A, 3B, and 3C is fabricated.

FIGS. 4-14B illustrate the process for fabricating bulk acoustic wave filter 52. Bulk acoustic wave filters 50 and 51 may be fabricated using a method similar to the method described with respect to FIGS. 4-14B.

Bulk acoustic wave filters 50-52 in the embodiments of the present disclosure provide the following advantages.

First, each one of first cavity 1000 and second cavity 2000 is formed above substrate 100, bonding layer 200, and boundary layer 360, and is enclosed by boundary structure 300. Boundary structure 300 has a double-wall structure with a certain thickness at the sides of first cavity 1000 and second cavity 2000, and is connected with piezoelectric layer 600, or bottom electrode 500 or 550. The bonding material (i.e., SiO$_2$) of bonding layer 200 is filled between the double walls of boundary structure 300. Bonding layer 200 is used to bond boundary layer 360 with substrate 100.

Second, each one of bottom electrodes 500 and 550 is partially located in first cavity 1000 or second cavity 2000. Bottom electrode 500 or 550 does not completely cross first cavity 1000 or second cavity 2000. Nor does bottom electrode 500 or 550 completely extend out of first cavity 1000 or second cavity 2000. Therefore, parasitic capacitance of the resonator formed by overlapping portions of bottom electrode 500 or 550, top electrode 700 or 750, and piezoelectric layer 600 outside of cavity 1000 or 2000 may be avoided, thereby improving the performance of the resonator and the filter including the same.

Third, first bulk acoustic wave resonator 20 and second bulk acoustic wave resonator 30 are arranged to be adjacent to each other. The sides of first bulk acoustic wave resonator 20 and second bulk acoustic wave resonator 30 that are adjacent to each other share the same boundary portion 300a. Therefore, there is no need for forming a completely independent boundary structure for each one of first cavity 1000 and second cavity 2000, thereby saving the resonator spacing and reducing the chip size.

Fourth, boundary portion 300a shared by the two resonators 20 and 30 is disconnected at at least one disconnection region 300a1, and first release hole 800 is arranged at disconnection region 300a1. As a result, the chip area occupied by first release hole 800 can be reduced and the chip size can be reduced.

Fifth, bottom electrode 500 or top electrode 700 may be formed with bottom opening 510 or top opening 710 that overlaps with first release hole 800. A lateral size of opening 510 or 710 along the X-Y plane is greater than the lateral diameter of first release hole 800.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A bulk acoustic wave filter, comprising:
   a first bulk acoustic wave resonator including, in an order from bottom to top, a first cavity, a first bottom electrode, a first segment of a piezoelectric layer, and a first top electrode;
   a second bulk acoustic wave resonator disposed adjacent to the first bulk acoustic wave resonator, and including, in the order from bottom to top, a second cavity, a second bottom electrode, a second segment of the piezoelectric layer, and a second top electrode;
   a boundary structure surrounding the first cavity and the second cavity, the boundary structure including a boundary portion extending between and separating the first cavity and the second cavity, and the boundary portion being disconnected at a disconnection region; and
   a first release hole formed in the piezoelectric layer, and overlapping the disconnection region.

2. The bulk acoustic wave filter of claim 1, wherein a length of the disconnection region along an extending direction of the boundary portion is greater than a diameter of the first release hole.

3. The bulk acoustic wave filter of claim 1, wherein:
   each of the first cavity and the second cavity has a polygon shape,
   the first cavity and the second cavity share a side, and
   the boundary portion extending between the first cavity and the second cavity extends along the side shared by the first cavity and the second cavity.

4. The bulk acoustic wave filter of claim 1, wherein:
   the first bottom electrode is separated from the second bottom electrode, and
   the first top electrode is separated from the second top electrode.

5. The bulk acoustic wave filter of claim 4, further comprising:
   a first gap between the first bottom electrode and the second bottom electrode; and
   a second gap between the first top electrode and the second top electrode,
   wherein the first release hole overlaps with the first gap and the second gap.

6. The bulk acoustic wave filter of claim 5, wherein each of a width of the first gap and a width of the second gap is greater than a diameter of the first release hole.

7. The bulk acoustic wave filter of claim 1, wherein:
   the first bottom electrode is separated from the second bottom electrode, and
   the first top electrode is integrally formed with the second top electrode to constitute a top electrode.

8. The bulk acoustic wave filter of claim 7, further comprising:
   a top opening formed in the top electrode and overlapping the first release hole.

9. The bulk acoustic wave filter of claim 8, wherein a size of the top opening is greater than a diameter of the first release hole.

10. The bulk acoustic wave filter of claim 1, wherein
    the first bottom electrode is integrally formed with the second bottom electrode to constitute a bottom electrode,
    the first top electrode is separated from the second top electrode.

11. The bulk acoustic wave filter of claim 10, further comprising:
    a bottom opening formed in the bottom electrode and overlapping the first release hole.

12. The bulk acoustic wave filter of claim 11, wherein a size of the bottom opening is greater than a diameter of the first release hole.

13. The bulk acoustic wave filter of claim 1, further comprising:
    a second release hole adjacent to a side of the first cavity or the second cavity.

14. The bulk acoustic wave filter of claim 13, wherein the boundary structure includes a protrusion protruding away from the first and second bottom electrodes and the first and second top electrodes, and
    the second release hole is located adjacent to the protrusion.

15. The bulk acoustic wave filter of claim 1, further comprising:
    a substrate;
    a support layer disposed on the substrate and including the first cavity and the second cavity;
    a bonding layer disposed between the substrate and the support layer and including a protruding structure; and
    a boundary layer overlying the bonding layer,
    wherein the boundary layer and the protruding structure of the bonding layer constitute the boundary structure surrounding the first cavity and the second cavity.

16. The bulk acoustic wave filter of claim 15, wherein the bonding layer is formed of $SiO_2$ for bonding the substrate and the boundary layer.

17. The bulk acoustic wave filter of claim 15, wherein the boundary layer is formed of SiN, AlN, polysilicon, amorphous silicon or a stacked combination of two or more of those materials.

18. The bulk acoustic wave filter of claim 15, wherein the support layer is formed of $SiO_2$.

19. The bulk acoustic wave filter of claim 15, wherein the substrate is formed of Si, glass, SiC, sapphire ($Al_2O_3$), or GaN.

20. The bulk acoustic wave filter of claim 1, wherein the piezoelectric layer includes aluminum nitride (AlN), zinc oxide (ZnO), lithium niobate ($LiNbO_3$), lithium tantalate ($LiTaO_3$), lead zirconate titanate (PZT), barium strontium titanate (BST), or a stacked combination of two or more of these materials.

* * * * *